United States Patent
Lee et al.

(10) Patent No.: US 11,805,681 B2
(45) Date of Patent: Oct. 31, 2023

(54) EMISSIVE DISPLAY DEVICE

(71) Applicant: Samsung Display Co., LTD., Yongin-si (KR)

(72) Inventors: Hae-Yeon Lee, Hwaseong-si (KR); Hyun-Chol Bang, Seongnam-si (KR); Su Jin Kim, Daejeon (KR); Bong Won Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 341 days.

(21) Appl. No.: 17/192,394

(22) Filed: Mar. 4, 2021

(65) Prior Publication Data
US 2021/0359056 A1  Nov. 18, 2021

(30) Foreign Application Priority Data
May 14, 2020  (KR) ........................ 10-2020-0057651

(51) Int. Cl.
*H01L 27/14* (2006.01)
*H10K 59/121* (2023.01)
(Continued)

(52) U.S. Cl.
CPC ....... *H10K 59/1213* (2023.02); *G09G 3/3233* (2013.01); *H10K 59/1216* (2023.02); *H10K 59/131* (2023.02); *G09G 2300/0819* (2013.01); *G09G 2300/0852* (2013.01); *G09G 2300/0861* (2013.01); *G09G 2320/0209* (2013.01);
(Continued)

(58) Field of Classification Search
CPC ........... H10K 59/1213; H10K 59/1216; H10K 59/131; G09G 3/3233; G09G 2300/0819; G09G 2300/0852; G09G 2300/0861; G09G 2320/0209; G09G 2320/0219; G09G 2320/0233; G09G 3/3225; H01L 27/1225; H01L 27/124; H01L 27/1251; H01L 27/1255; H01L 29/78675; H01L 29/7869;
(Continued)

(56) References Cited

FOREIGN PATENT DOCUMENTS

EP        3660827 A1 * 11/2019
KR    10-2004-0023890     3/2004
(Continued)

*Primary Examiner* — Tan N Tran
(74) *Attorney, Agent, or Firm* — KILE PARK REED & HOUTTEMAN PLLC

(57) ABSTRACT

An emissive display device includes a polycrystalline semiconductor including a channel, source region, and drain region of a driving transistor disposed on a substrate. The device includes a gate electrode of the driving transistor overlapping the channel of the driving transistor, an oxide semiconductor including a channel, a source region, and a drain region of a second transistor disposed on the substrate, and a first connection electrode. The first connection electrode includes a first connector electrically connected to the gate electrode of the driving transistor, a second connector electrically connected to a second electrode of the second transistor, and a main body disposed between the first connector and the second connector. The device includes an initialization voltage line disposed on the substrate and applying an initialization voltage. The initialization voltage line surrounds at least a part of the second connector of the first connection electrode.

20 Claims, 13 Drawing Sheets

(51) Int. Cl.
 *G09G 3/3233* (2016.01)
 *H10K 59/131* (2023.01)
 *H01L 29/786* (2006.01)
 *H01L 27/12* (2006.01)

(52) U.S. Cl.
 CPC .... *G09G 2320/0219* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01)

(58) Field of Classification Search
 CPC ............. H01L 27/1248; H01L 27/3276; H01L 27/3262; H01L 27/362
 USPC ..................................................... 257/59, 72
 See application file for complete search history.

(56) References Cited

FOREIGN PATENT DOCUMENTS

| | | |
|---|---|---|
| KR | 10-2016-0089032 | 7/2016 |
| KR | 10-2016-0100050 | 8/2016 |
| KR | 10-2017-0141855 | 12/2017 |
| KR | 10-2020-0073347 | 6/2020 |

\* cited by examiner

EMISSIVE DISPLAY DEVICE

CROSS-REFERENCE TO RELATED APPLICATION(S)

This application claims priority to and benefits of Korean Patent Application No. 10-2020-0057651 under 35 U.S.C. § 119, filed in the Korean Intellectual Property Office on May 14, 2020, the entire contents of which are incorporated herein by reference.

BACKGROUND

1. Technical Field

The disclosure relates to an emissive display device.

2. Description of the Related Art

From among emissive display devices, an organic light emitting device may include two electrodes and an organic emission layer disposed therebetween, and electrons injected from one electrode may be combined with holes injected from the other electrode on the organic emission layer to form excitons. The excitons may transit to a ground state from an excited state to output energy and emit light.

The organic light emitting device may include pixels including an organic light emitting diode that may be a self-light-emitting device, and transistors and at least one capacitor for driving the organic light emitting diode may be formed on respective pixels. The transistors may include a switching transistor and a driving transistor.

A number of pixels may be increased so as to increase a resolution of the organic light emitting device, an aperture ratio may be reduced in a high-speed driving process so as to realize stable video, a current density may be increased, and a driving voltage may increase. Accordingly, stains may be generated, and reliability of elements such as transistors may be deteriorated.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to improve quality of an emissive display device by preventing generation of stains and crosstalk.

An embodiment may provide an emissive display device that may include a polycrystalline semiconductor including a channel, a source region, and a drain region of a driving transistor disposed on a substrate. The emissive display device may include a gate electrode of the driving transistor overlapping the channel of the driving transistor, an oxide semiconductor including a channel, a source region, and a drain region of a second transistor disposed on the substrate, and a first connection electrode. The first connection electrode may include a first connector electrically connected to the gate electrode of the driving transistor, a second connector electrically connected to a second electrode of the second transistor, and a main body disposed between the first connector and the second connector. The emissive display device may include an initialization voltage line disposed on the substrate and applying an initialization voltage, wherein the initialization voltage line may surround at least a part of the second connector of the first connection electrode.

The emissive display device may further include a third transistor disposed on the substrate and including a channel, a source region and a drain region, wherein the polycrystalline semiconductor may form the channel, the source region, and drain region of the third transistor, and a fourth transistor disposed on the substrate and including a channel, a source region, and a drain region, wherein the oxide semiconductor may form the channel, the source region, and the drain region of the fourth transistor. The initialization voltage line may further include a first initialization voltage line electrically connected to the source region of the fourth transistor, and a second initialization voltage line electrically connected to the drain region of the third transistor.

The second initialization voltage line may surround at least a part of the second connector of the first connection electrode.

The emissive display device may further include a scan line disposed on the substrate and extending in a first direction, and a data line extending in a second direction that may be perpendicular to the first direction. The first initialization voltage line may extend in the first direction, and the second initialization voltage line may extend in a zigzag shape and include a curved portion in the first direction.

A part of the curved portion of the second initialization voltage line may surround the second connector of the first connection electrode on three sides.

The emissive display device may further include a first gate insulating layer disposed on the polycrystalline semiconductor and covering the polycrystalline semiconductor, a first interlayer insulating layer disposed on the first gate insulating layer and covering the first gate insulating layer and the gate electrode of the driving transistor, a second interlayer insulating layer disposed on the first interlayer insulating layer and covering the first interlayer insulating layer, a second gate insulating layer disposed on the second interlayer insulating layer and covering the second interlayer insulating layer, a third interlayer insulating layer disposed on the second gate insulating layer and covering the second gate insulating layer, and a first planarization film disposed on the third interlayer insulating layer and covering the third interlayer insulating layer. The oxide semiconductor may be disposed between the second interlayer insulating layer and the second gate insulating layer.

The first connection electrode may be disposed between the third interlayer insulating layer and the first planarization film, and the first initialization voltage line, the second initialization voltage line, and the first connection electrode may be disposed on a same layer.

The emissive display device may further include a data line disposed on the first planarization film.

The first connector of the first connection electrode may be electrically connected to the gate electrode of the driving transistor through a first opening formed in the first interlayer insulating layer, the second interlayer insulating layer, the second gate insulating layer, and the third interlayer insulating layer.

The second connector of the first connection electrode may be electrically connected to the source region of the second transistor through a second opening formed in the second gate insulating layer and the third interlayer insulating layer.

Another embodiment may provide an emissive display device including pixels respectively including at least one transistor and a storage capacitor disposed on a substrate. The at least one transistor may include a driving transistor including a gate electrode, a channel overlapping the gate electrode, a source region, and a drain region, the channel being disposed between the source region and the drain region, a second transistor including a second gate electrode, a channel overlapping the second gate electrode, a source region, and a drain region, the channel being disposed between the source region and the train region, a third transistor including a third gate electrode, a channel overlapping the third gate electrode, a source region, and a drain region, the channel being disposed between the source region and the drain region, and a fourth transistor including a fourth gate electrode, a channel overlapping the fourth gate electrode, a source region, and a drain region, the channel being disposed between the source region and the drain region. The channels, the source regions, and the drain regions of the driving transistor and the second transistor may include polycrystalline semiconductors. The channels, the source regions, and the drain regions of the third transistor and the fourth transistor may include oxide semiconductors. Gaps of gate electrodes of driving transistors disposed on adjacent ones of the pixels may be substantially identical.

The pixels may further include a first storage electrode overlapping the gate electrode of the driving transistor, and a first interlayer insulating layer disposed between the gate electrode of the driving transistor and the first storage electrode, and the first storage electrode and the gate electrode of the driving transistor may form the storage capacitor.

The pixels may further include a first connection electrode including a first connector electrically connected to the gate electrode of the driving transistor, a second connector electrically connected to the drain region of the third transistor, and a main body disposed between the first connector and the second connector.

The at least one transistor may further include a fifth transistor including a fifth gate electrode, a channel overlapping the fifth gate electrode, a source region, and a drain region, the channel being disposed between the source region and the drain region. The pixels may further include a first initialization voltage line disposed on the substrate and electrically connected to the source region of the fourth transistor, and a second initialization voltage line disposed on the substrate and electrically connected to the drain region of the fifth transistor.

The second initialization voltage line may surround at least a part of the second connector of the first connection electrode in a plan view.

The pixels may further include a scan line disposed on the substrate and extending in a first direction, and a data line extending in a second direction that may be perpendicular to the first direction. The first initialization voltage line may extend in the first direction, and the second initialization voltage line may extend with a zigzag shape and include a curved portion in the first direction.

The emissive display device may further include a first gate insulating layer disposed on the polycrystalline semiconductor and covering the polycrystalline semiconductor, a first interlayer insulating layer disposed on the first gate insulating layer and covering the first gate insulating layer and the gate electrode of the driving transistor, a second interlayer insulating layer disposed on the first interlayer insulating layer and covering the first interlayer insulating layer, a second gate insulating layer disposed on the second interlayer insulating layer and covering the second interlayer insulating layer, a third interlayer insulating layer disposed on the second gate insulating layer and covering the second gate insulating layer, and a first planarization film disposed on the third interlayer insulating layer and covering the third interlayer insulating layer. The oxide semiconductor may be disposed between the second interlayer insulating layer and the second gate insulating layer.

The first connection electrode may be disposed between the third interlayer insulating layer and the first planarization film, and the first initialization voltage line, the second initialization voltage line, and the first connection electrode may be disposed on a same layer.

The emissive display device may further include a data line disposed on the first planarization film.

The pixels may respectively include a boost capacitor, the boost capacitor including a source region of the boost capacitor electrically connected to the second gate electrode of the second transistor, and a drain region of the boost capacitor electrically connected to the drain region of the third transistor.

According to the embodiments, the stains that may be generated as the gaps of the driving gate electrode are irregularly disposed may be reduced by regularly forming the gaps between the driving gate electrodes on pixels.

Further, the parasitic capacitor and the crosstalk between the data line and the driving gate electrode may be minimized by positioning the second initialization voltage line between the first connection electrode and the data line. Accordingly, interference between the data signal transmitted through the data line and the gate voltage applied to the gate electrode of the driving transistor may be prevented.

For example, quality of the emissive display device may be improved.

DETAILED DESCRIPTION OF THE EMBODIMENTS

Figure 1:
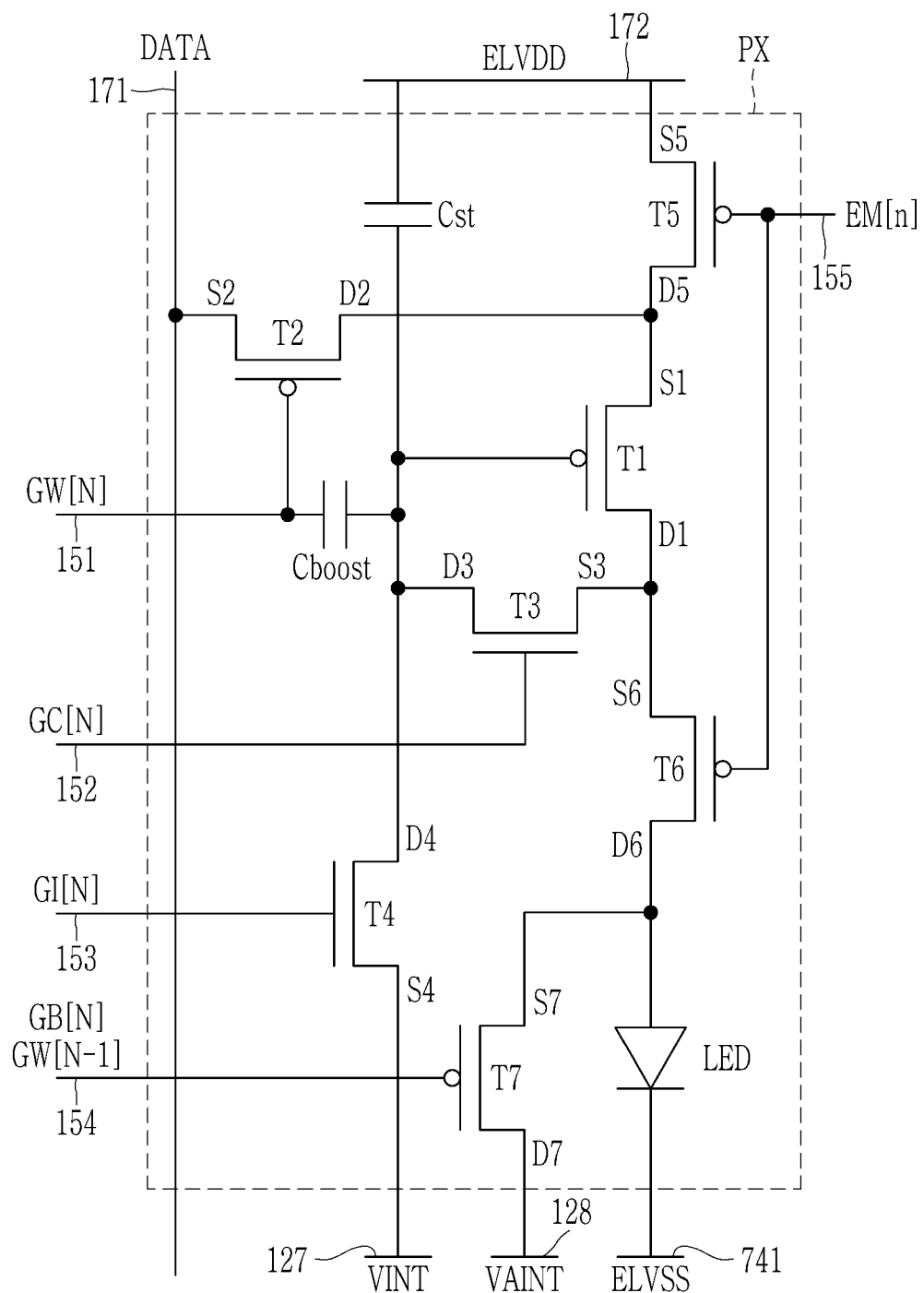
FIG. 1 shows a schematic circuit diagram of an emissive display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the invention.

Parts that are irrelevant to the description will be omitted to clearly describe the invention. Identical or similar elements will be designated by the same reference numerals throughout the specification.

The size and thickness of each configuration shown in the drawings may be arbitrarily shown for better understanding and ease of description, but the invention is not limited thereto. In the drawings, the thickness of layers, films, panels, regions, etc., may be exaggerated for clarity. The thicknesses of some layers and areas may be exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there may be no intervening elements present. The word "on" or "above" means disposed on or below the object portion, and does not necessarily mean disposed on the upper side of the object portion based on a gravitational direction.

Unless explicitly described to the contrary, the words "have", "has", "comprise", "include", and variations such as "having", "comprises", "comprising", "includes", and "including" will be understood to imply the inclusion of stated elements but not the exclusion of any other elements.

Terms such as "overlap" and "overlapping" may include layer, stack, face or facing, extending over, covering or partly covering or any other suitable term as would be appreciated and understood by those of ordinary skill in the art. The expression "not overlap" may include "apart from" or "set aside from" or "offset from" and any other suitable equivalents as would be appreciated and understood by those of ordinary skill in the art.

The phrase "in a plan view" means viewing the object portion from the top, and the phrase "in a cross-sectional view" means viewing a cross-section of which the object portion is vertically cut from the side.

The phrase "at least one of" is intended to include the meaning of "at least one selected from the group of" for the purpose of its meaning and interpretation. For example, "at least one of A and B" may be understood to mean "A, B, or A and B." The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Hereinafter, an emissive display device will now be described with reference to accompanying drawings.

A pixel of an emissive display device according to an embodiment will now be described.

FIG. 1 shows a schematic circuit diagram of an emissive display device according to an embodiment.

Referring to FIG. 1, the pixel PX of an emissive display device according to an embodiment may include transistors T1, T2, T3, T4, T5, T6, and T7, a storage capacitor Cst, a boost capacitor Cboost, and a light emitting diode (LED) electrically connected to signal lines 127, 128, 151, 152, 153, 154, 155, 171, 172, and 741. The emissive display device according to an embodiment may include a display area for displaying images, and the pixel PX may be arranged in various forms in the display area.

Signal lines 127, 128, 151, 152, 153, 154, 155, 171, 172, and 741 may be electrically connected to a pixel PX. Signal lines may include a first initialization voltage line 127, a second initialization voltage line 128, a scan line 151, an inverted scan line 152, an initialization control line 153, a bypass control line 154, an emission control line 155, a data line 171, a driving voltage line 172, and a common voltage line 741.

The emissive display device according to an embodiment may dispose (e.g., position) the second initialization voltage line 128 for transmitting a constant voltage between the first connection electrode 1175 (FIG. 2) for connecting a gate electrode of the driving transistor T1 and a second electrode D3 of the third transistor T3 and the data line 171 to thus prevent a change of voltage at the data line 171 from being transmitted to the first connection electrode 1175, and prevent crosstalk between the driving gate electrode 1151 (FIG. 2) and the data line 171. These characteristics will be described in detail with reference to FIG. 2, and signal lines 127, 128, 151, 152, 153, 154, 155, 171, 172, and 741 will now be described in detail.

The scan line 151 may be electrically connected to a gate driver (not shown) and a second gate electrode of the second transistor T2, and transmit a scan signal (GW) to the second transistor T2.

The inverted scan line 152 may be electrically connected to a third gate electrode of the third transistor T3, and a voltage with opposite polarity to the voltage may be applied to the scan line 151 at the same time as the signal of the scan line 151. For example, in case that a high voltage may be applied to the scan line 151, a low voltage may be applied to the inverted scan line 152. The inverted scan line 152 transmits an inverted scan signal (GC) to the third transistor T3.

The initialization control line 153 may be electrically connected to a fourth gate electrode of the fourth transistor T4, and transmit the initialization control signal (GI) to the fourth transistor T4.

The bypass control line 154 may be electrically connected to a seventh gate electrode of the seventh transistor T7, and transmit a bypass signal (GB) to the seventh transistor T7. The bypass control line 154 may include one pixel PX and a scan line 151 at a previous end of an adjacent pixel PX.

The emission control line 155 may be electrically connected to a fifth gate electrode of the fifth transistor T5 and a sixth gate electrode of the sixth transistor T6, and transmit an emission control signal (EM) to the fifth transistor T5 and the sixth transistor T6.

The data line 171 may be electrically connected to a first electrode S2 of the second transistor T2, it may be a wire for transmitting a data voltage (DATA) generated by a data driver (not shown), and luminance of light emitted by the light emitting diode (LED) changes according to the data voltage (DATA) applied to the pixel PX.

The driving voltage line 172 may be electrically connected to a first electrode S5 of the fifth transistor T5, and apply a driving voltage (ELVDD). The first initialization voltage line 127 may be electrically connected to a first electrode S4 of the fourth transistor T4, and transmit a first initialization voltage (VINT). The second initialization voltage line 128 may be electrically connected to a second electrode D7 of the seventh transistor T7, and transmit a second initialization voltage (VAINT). The common voltage line 741 may apply a common voltage (ELVSS) to a cathode of the light emitting diode (LED). In the embodiment, voltages applied to the driving voltage line 172, the first initialization voltage line 127, the second initialization voltage line 128, and the common voltage line 741 may be constant, respectively.

A configuration and a connection relationship of transistors will now be described in detail.

The first transistor, for example, the driving transistor T1, may have a p-type transistor characteristic, and may include a polycrystalline semiconductor. The driving transistor T1 may control a current output to an anode of the light emitting diode (LED) according to the data voltage (DATA) applied to the gate electrode of the driving transistor T1. Brightness of the light emitting diode (LED) may be controlled according to the driving current output to the anode of the light emitting diode (LED), so luminance of the light emitting diode (LED) may be controlled according to the data voltage (DATA) applied to the pixel PX. For this purpose, the first electrode S1 of the driving transistor T1 may be disposed so that it may receive a driving voltage (ELVDD), and it may be electrically connected to the driving voltage line 172 through the fifth transistor T5. The first electrode S1 of the driving transistor T1 may be electrically connected to the second electrode D2 of the second transistor T2 and receive the data voltage (DATA). The second electrode D1 of the driving transistor T1 may be disposed so that it may output a current to the light emitting diode (LED), and it may be electrically connected to the anode of the light emitting diode (LED) through the sixth transistor T6. The second electrode D1 of the driving transistor T1 may transmit the data voltage (DATA) applied to the first electrode S1 to the third transistor T3. The gate electrode of the driving transistor T1 may be electrically connected to one electrode (hereinafter, a second storage electrode) of the storage capacitor Cst. Accordingly, a voltage at the gate electrode of the driving transistor T1 may change according to the voltage charged in the storage capacitor Cst, and a driving current output by the driving transistor T1 may change. The storage capacitor Cst may also maintain the voltage at the gate electrode of the driving transistor T1 for one frame.

The second transistor T2 may have a p-type transistor characteristic, and may include a polycrystalline semiconductor. The second transistor T2 may allow the data voltage (DATA) to be received into the pixel PX. The gate electrode of the second transistor T2 may be electrically connected to the scan line 151 and the first electrode of the boost capacitor (Cboost). The first electrode S2 of the second transistor T2 may be electrically connected to the data line 171. The second electrode D2 of the second transistor T2 may be electrically connected to the first electrode S1 of the driving transistor T1. In case that the second transistor T2 is turned on by a low voltage from among the scan signal (GW) transmitted through the scan line 151, the data voltage (DATA) transmitted through the data line 171 may be transmitted to the first electrode S1 of the driving transistor T1.

The third transistor T3 may have an n-type transistor characteristic, and may include an oxide semiconductor. The third transistor T3 may electrically connect the second electrode D1 of the driving transistor T1 and the gate electrode of the driving transistor T1. As a result, it may allow a compensation voltage that may be generated in case that the data voltage (DATA) may be changed by passing through the driving transistor T1 to be transmitted to the second storage electrode of the storage capacitor Cst. The gate electrode of the third transistor T3 may be electrically connected to the inverted scan line 152, and the first electrode S3 of the third transistor T3 may be electrically connected to the second electrode D1 of the driving transistor T1. The second electrode D3 of the third transistor T3 may be electrically connected to the second storage electrode of the storage capacitor Cst, the gate electrode of the driving transistor T1, and the second electrode of the boost capacitor (Cboost). The third transistor T3 may be turned on by a high voltage from among the inverted scan signal (GC) transmitted through the inverted scan line 152 to connect the gate electrode of the driving transistor T1 and the second electrode D1 of the driving transistor T1, and it may transmit the voltage applied to the gate electrode of the driving transistor T1 to the second storage electrode of the storage capacitor Cst to store the same in the storage capacitor Cst.

The fourth transistor T4 may have an n-type transistor characteristic, and may include an oxide semiconductor. The fourth transistor T4 may initialize the gate electrode of the driving transistor T1 and the second storage electrode of the storage capacitor Cst. The gate electrode of the fourth transistor T4 may be electrically connected to the initialization control line 153, and the first electrode S4 of the fourth transistor T4 may be electrically connected to the first initialization voltage line 127. The second electrode D4 of the fourth transistor T4 may be electrically connected to the second storage electrode of the storage capacitor Cst, the gate electrode of the driving transistor T1, and the second electrode of the boost capacitor (Cboost) through the second electrode D3 of the third transistor T3. The fourth transistor T4 may be turned on by a high voltage from among the initialization control signal (GI) transmitted through the initialization control line 153, and in this instance, it may transmit the first initialization voltage (VINT) to the gate electrode of the driving transistor T1 and the second storage electrode of the storage capacitor Cst. Hence, the voltage at the gate electrode of the driving transistor T1 and the storage capacitor Cst may be initialized.

The fifth transistor T5 may have a p-type transistor characteristic, and may include a polycrystalline semiconductor. The fifth transistor T5 may transmit a driving voltage (ELVDD) to the driving transistor T1. The gate electrode of the fifth transistor T5 may be electrically connected to the emission control line 155, the first electrode S5 of the fifth transistor T5 may be electrically connected to the driving voltage line 172, and the second electrode D5 of the fifth transistor T5 may be electrically connected to the first electrode S1 of the driving transistor T1.

The sixth transistor T6 may have a p-type transistor characteristic, and may include a polycrystalline semiconductor. The sixth transistor T6 may transmit the driving current output by the driving transistor T1 to the light emitting diode (LED). The gate electrode of the sixth transistor T6 may be electrically connected to the emission control line 155, the first electrode S6 of the sixth transistor T6 may be electrically connected to the second electrode D1 of the driving transistor T1, and the second electrode D6 of the sixth transistor T6 may be electrically connected to the anode of the light emitting diode (LED).

The seventh transistor T7 may have a p-type transistor characteristic, and may include a polycrystalline semiconductor. The seventh transistor T7 may initialize the anode of the light emitting diode (LED). The gate electrode of the seventh transistor T7 may be electrically connected to the bypass control line 154, the first electrode S7 of the seventh transistor T7 may be electrically connected to the anode of the light emitting diode (LED), and the second electrode D7 of the seventh transistor T7 may be electrically connected to the second initialization voltage line 128. In case that the seventh transistor T7 may be turned on by a low voltage from among the bypass signal (GB), the second initialization voltage (VAINT) may be applied to the anode of the light emitting diode (LED) to be initialized.

It is described in an embodiment that one pixel includes seven transistors T1 to T7, one storage capacitor Cst, and one boost capacitor (Cboost), but the number of transistors and capacitors, and their connection relationships, are modifiable in many ways.

The driving transistor T1 may include a polycrystalline semiconductor. The third transistor T3 and the fourth transistor T4 may include oxide semiconductors. The second transistor T2, the fifth transistor T5, the sixth transistor T6, and the seventh transistor T7 may include polycrystalline semiconductors. The second transistor T2, the fifth transistor T5, the sixth transistor T6, and the seventh transistor T7 are not limited thereto, and at least one thereof may include an oxide semiconductor. The third transistor T3 and the fourth transistor T4 may include the driving transistor T1 and semiconductor materials that may be different from each other, so they may be operable in a further secure way and reliability may be improved.

As described above, a low voltage may be applied to the inverted scan line 152 in case that a high voltage may be applied to the scan line 151, and a high voltage may be applied to the inverted scan line 152 in case that a low voltage may be applied to the scan line 151. For example, the inverted scan signal (GC) applied to the inverted scan line 152 may include a scan signal (GW) applied to the scan line 151 and an inverted signal, so it may reduce the gate voltage of the driving transistor T1 after the data voltage (DATA) may be written. On the contrary, the scan signal (GW) may increase the gate voltage of the driving transistor T1. Therefore, in case that a black voltage may be written, the black voltage may be reduced. In an embodiment, the boost capacitor (Cboost) may be positioned between the scan line 151 for applying a scan signal (GW) and the gate electrode of the driving transistor T1, thereby increasing the gate voltage of the driving transistor T1 and stably outputting the black voltage. As capacity of the boost capacitor (Cboost) increases, the gate voltage of the driving transistor T1 may be further increased. The gate voltage of the driving transistor T1 may be controlled by controlling the capacity of the boost capacitor (Cboost).

The gate signal applied to the gate electrode 1151 (FIG. 2) of the driving transistor T1 may be changed by a change of the data signal of the data line 171. Such crosstalk may change a driving current value, and may deteriorate quality of the emissive display device. However, the emissive display device according to an embodiment may prevent the crosstalk between the first connection electrode 1175 and the data line 171 as the initialization voltage line 128 for transmitting a constant voltage may be positioned between the first connection electrode 1175 for transmitting the gate signal applied to the driving gate electrode 1151 and the data line 171.

A planar and cross-sectional configuration of a driving transistor T1, a third transistor T3, a fourth transistor T4, and a seventh transistor T7 will now be described with reference to FIG. 2 to FIG. 12.

Figure 2:
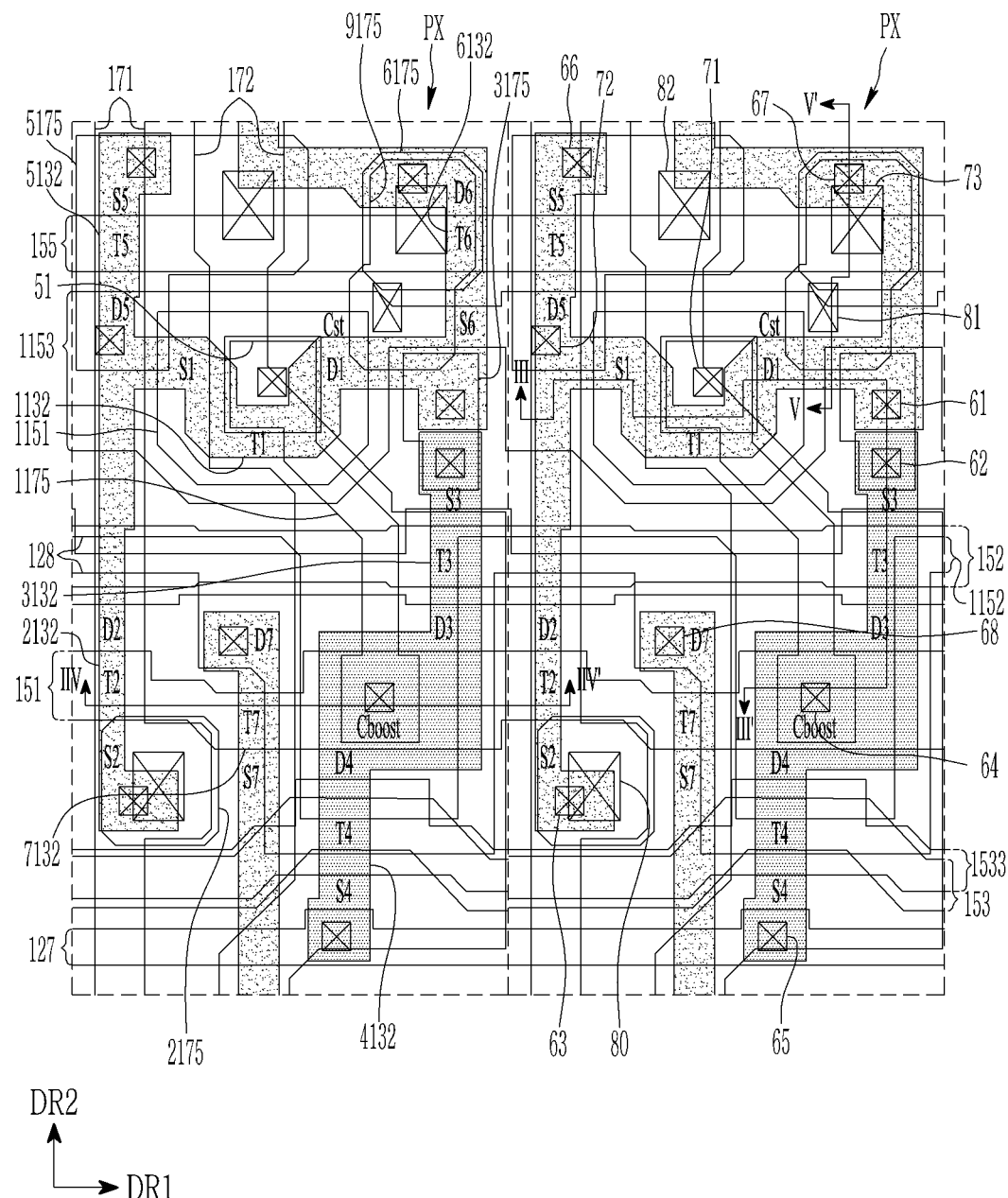
FIG. 2 shows a schematic top plan view of an emissive display device according to an embodiment.
Figure 3:
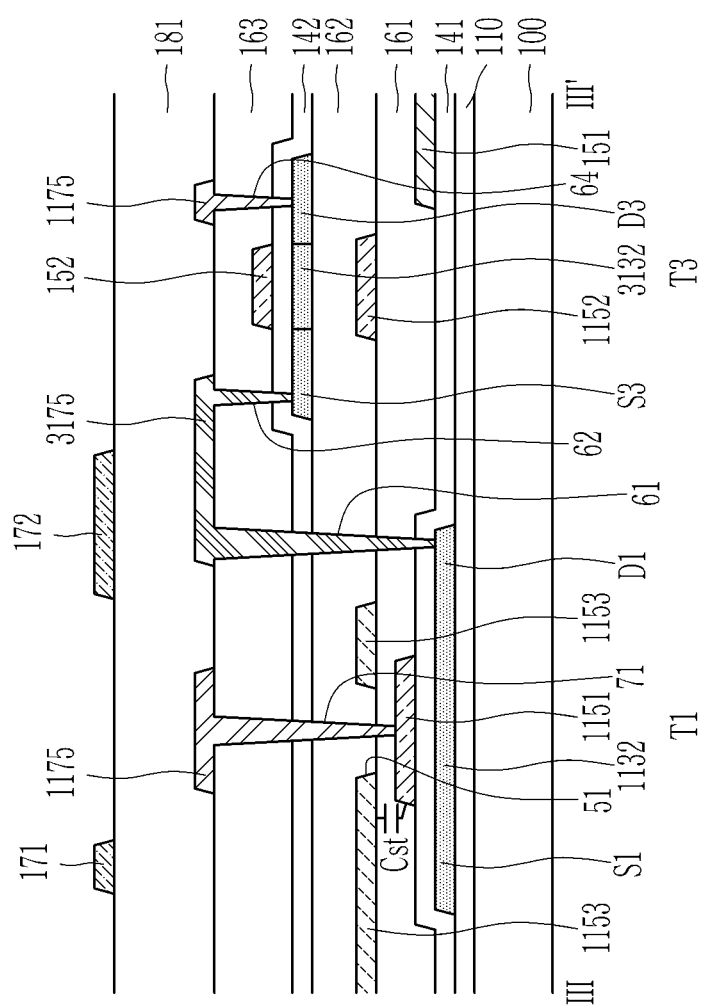
FIG. 3 shows a schematic cross-sectional view with respect to line III-III' of FIG. 2.
Figure 4:
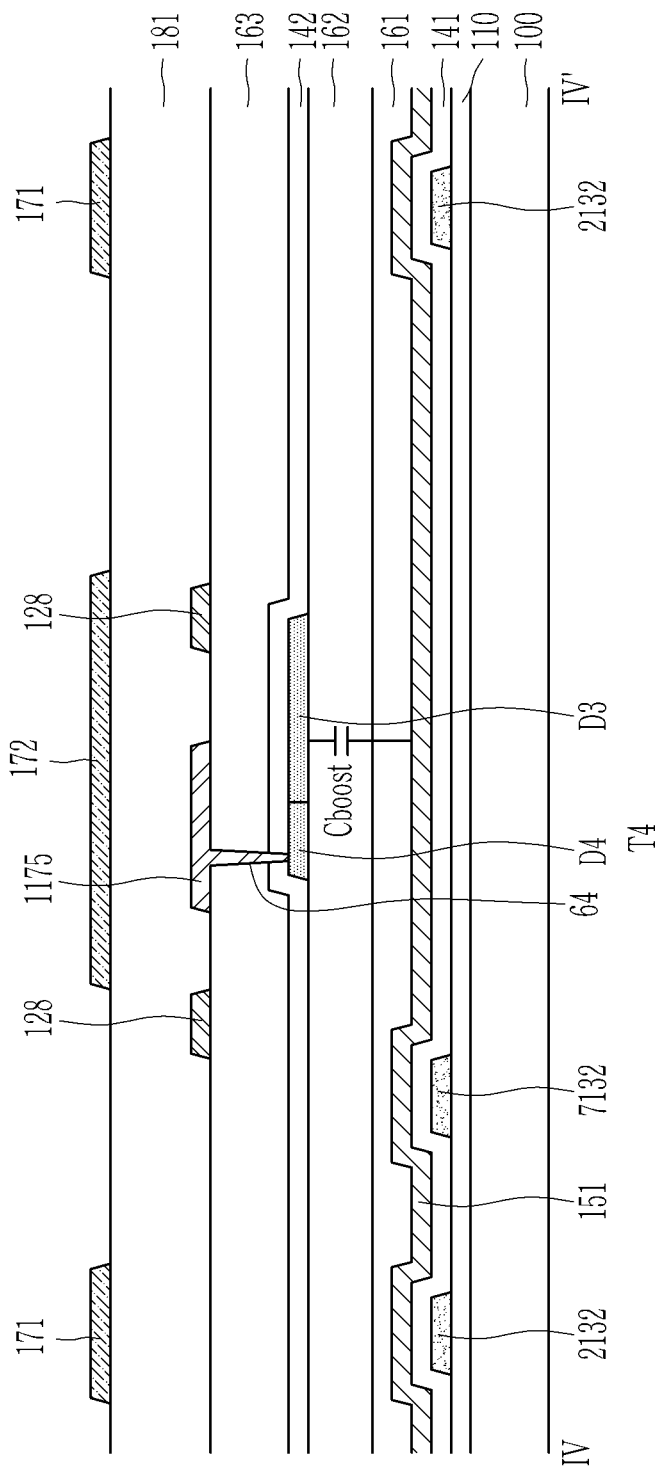
FIG. 4 shows a schematic cross-sectional view with respect to line IV-IV' of FIG. 2.
Figure 5:
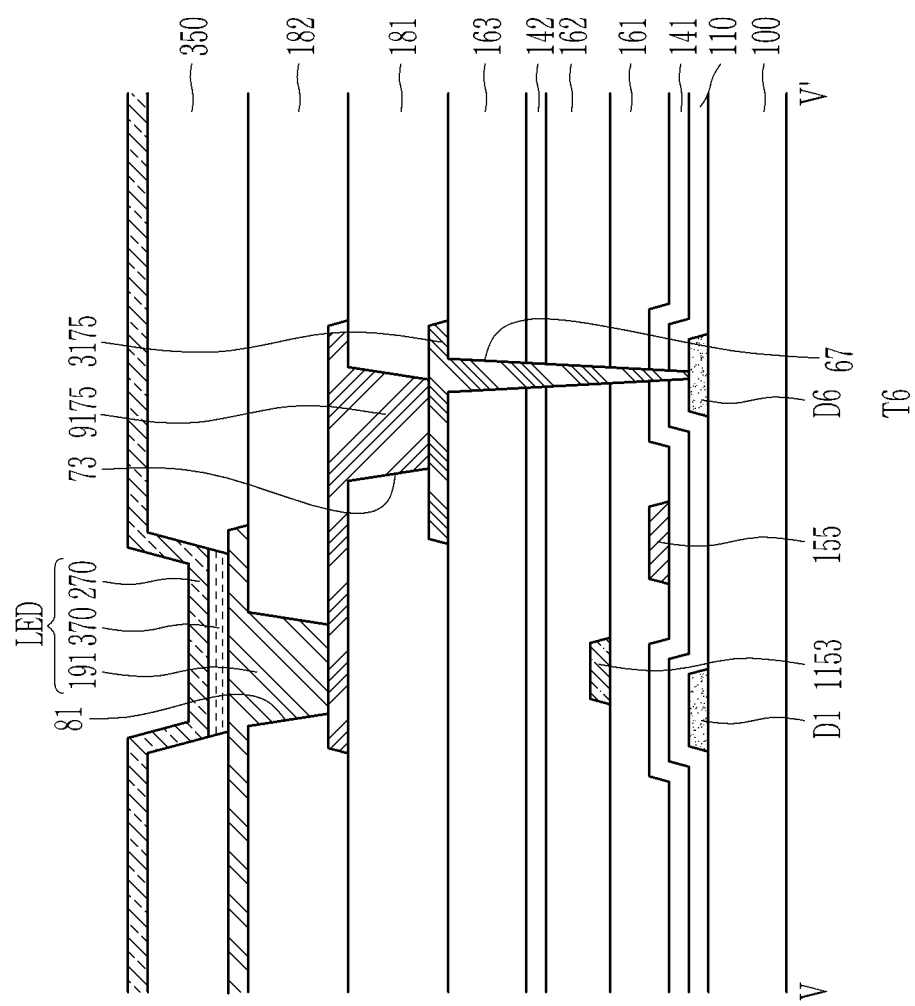
FIG. 5 shows a schematic cross-sectional view with respect to line V-V' of FIG. 2.

FIG. 2 shows a schematic top plan view of an emissive display device according to an embodiment. FIG. 3 shows a schematic cross-sectional view with respect to line of FIG. 2. FIG. 4 shows a schematic cross-sectional view with respect to line IV-IV' of FIG. 2, and FIG. 5 shows a schematic cross-sectional view with respect to line V-V' of FIG. 2. FIG. 6 to FIG. 12 show sequential schematic top plan views of an emissive display device according to an embodiment in a manufacturing order.

FIG. 2 to FIG. 12 show two adjacent pixels PX, and the pixels PX may substantially have a same shape. The emissive display device may include pixels PX, and the pixels PX may have a same shape and may be repeatedly arranged.

Figure 6:
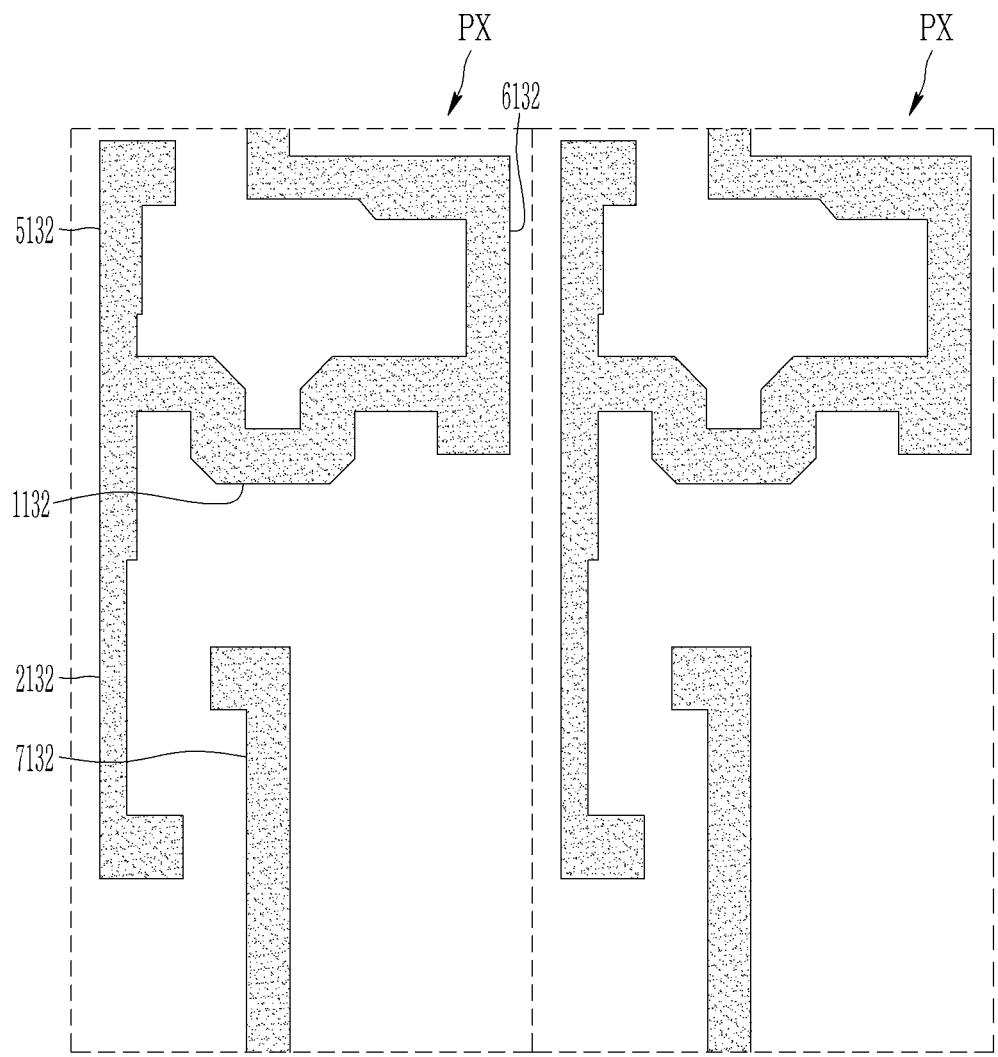
FIG. 6 to FIG. 12 show sequential schematic top plan views of an emissive display device according to an embodiment in a manufacturing order.

As shown in FIG. 2 to FIG. 12, a polycrystalline semiconductor including a channel 1132, a first electrode S1, and a second electrode D1 of the driving transistor T1, and a channel 6132, a first electrode S6, and a second electrode D6 of the sixth transistor T6, may be positioned on the substrate 100. FIG. 6 shows a polycrystalline semiconductor. The polycrystalline semiconductor may further include channels 2132, 5132, and 7132, first electrodes, and second electrodes of the second transistor T2, the fifth transistor T5, and the seventh transistor T7 as well as the driving transistor T1 and the sixth transistor T6. The first electrode of each of the transistors may be a source region of a semiconductor, and the second electrode thereof may be a drain region of the semiconductor.

The channel 1132 of the driving transistor T1 may have a bent shape in a plan view. However, the shape of the channel 1132 of the driving transistor T1 is not limited thereto, and it is modifiable in many ways. For example, the channel 1132 of the driving transistor T1 may be bent as another shape, and it may have a bar shape. The first electrode S1 and the second electrode D1 of the driving transistor T1 may be positioned on respective sides of the channel 1132 of the driving transistor T1. The first electrode S1 of the driving transistor T1 may extend in a second direction DR2 in a plan view, a portion extending downward may be extended to the second electrode D2 of the second transistor T2, while a portion extending upward may be extended to the second electrode D5 of the fifth transistor T5. The second electrode D1 of the driving transistor T1 may extend upward in a plan view and may be extended to the first electrode S6 of the sixth transistor T6.

The channel 6132 of the sixth transistor T6 may have a bar shape in a plan view. The shape of the channel 6132 of the sixth transistor T6 is not limited thereto, and it is modifiable in various ways. The first electrode S6 and the second electrode D6 of the sixth transistor T6 may be positioned on respective sides of the channel 6132 of the sixth transistor T6. The first electrode S6 of the sixth transistor T6 may be positioned below the channel 6132 in a plan view. The first electrode S6 of the sixth transistor T6 may extend downward in a plan view, and may be extended to the second electrode D1 of the driving transistor T1. The second electrode D6 of the sixth transistor T6 may be positioned above the channel 6132 in a plan view, and it may be extended to the first electrode S7 of the seventh transistor T7 of the pixel PX that may be adjacent in the second direction DR2.

A buffer layer 110 may be positioned between the substrate 100 and the polycrystalline semiconductor including the channel 1132, the first electrode S1, and the second electrode D1 of the driving transistor T1 and the channel 6132, the first electrode S6, and the second electrode D6 of the sixth transistor T6. The buffer layer 110 may have a single-layered or multi-layered structure. The buffer layer 110 may include an organic insulating material, an inorganic insulating material, or a combination thereof.

A first gate insulating layer 141 may be positioned on the polycrystalline semiconductor including the channel 1132, the first electrode S1, and the second electrode D1 of the driving transistor T1 and the channel 6132, the first electrode S6, and the second electrode D6 of the sixth transistor T6. The first gate insulating layer 141 may include a silicon nitride, a silicon oxide, or a combination thereof.

Figure 7:
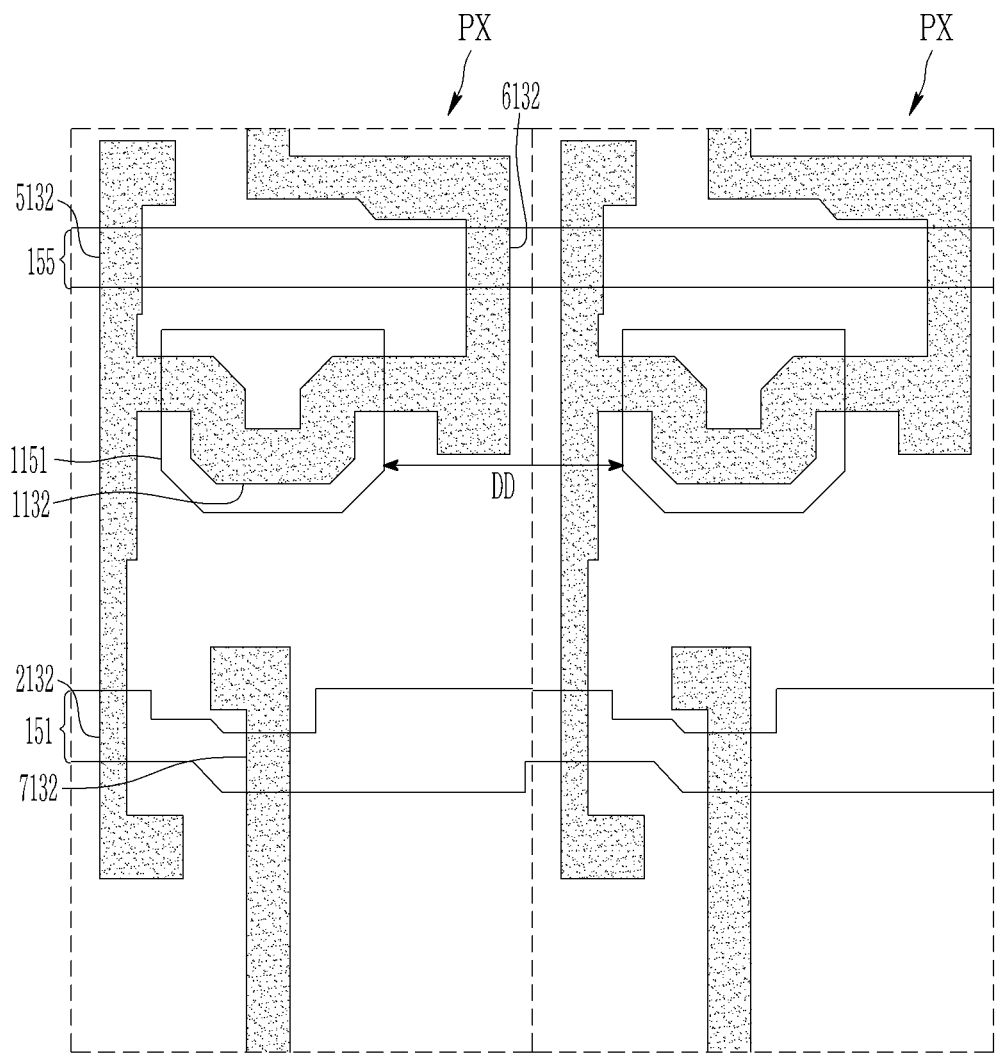

A first gate conductor including the gate electrode 1151 of the driving transistor T1 may be positioned on the first gate insulating layer 141. FIG. 7 illustrates a polycrystalline semiconductor and a first gate conductor.

The gate electrode 1151 of the driving transistor T1 may overlap the channel 1132 of the driving transistor T1. The channel 1132 of the driving transistor T1 may be covered by the gate electrode 1151 of the driving transistor T1.

Referring to FIG. 7, the gate electrode 1151 of the driving transistor T1 of one pixel PX may be positioned from the gate electrode 1151 of the driving transistor T1 of a pixel PX that may be adjacent to the one pixel PX in a first direction DR1 with an interval (DD). In detail, in case that a first pixel, a second pixel, and a third pixel neighboring each other may be positioned in the first direction DR1, a gap between the gate electrode 1151 positioned on the first pixel and the gate electrode 1151 positioned on the second pixel may correspond to, or be substantially the same as, the gap between the gate electrode 1151 positioned on the second pixel and the gate electrode 1151 positioned on the third pixel. Accordingly, the emissive display device according to the embodiment has a substantially constant gap of the driving gate electrode or the driving transistor channel on pixels, so stains that may be generated as the gap of the driving gate electrode or the driving transistor channel may be irregularly disposed may be reduced. For example, quality of the emissive display device may be improved.

The first gate conductor may further include a scan line 151 and an emission control line 155. The scan line 151 and the emission control line 155 may substantially extend in the first direction DR1. The scan line 151 may be electrically connected to the gate electrode of the second transistor T2, the seventh transistor T7, and the first electrode of the boost capacitor (Cboost). The gate electrode of the fifth transistor T5 and the gate electrode of the sixth transistor T6 may be electrically connected to the emission control line 155. A first gate conductor including the gate electrode 1151 of the driving transistor T1, the scan line 151, and the emission control line 155 may be formed and a doping process may be performed. Except for the polycrystalline semiconductor covered by the first gate conductor, a portion of the polycrystalline semiconductor not covered by the first gate conductor may be doped to have a same characteristic as a conductor. In this instance, the doping process may progress with a p-type dopant, and the driving transistor T1 including a polycrystalline semiconductor, the second transistor T2, the fifth transistor T5, the sixth transistor T6, and the seventh transistor T7 may have a p-type transistor characteristic.

A first interlayer insulating layer 161 may be positioned on the first gate conductor including the gate electrode 1151 of the driving transistor T1, the scan line 151, and the emission control line 155, and the first gate insulating layer 141. The first interlayer insulating layer 161 may include a silicon nitride, a silicon oxide, or a combination thereof.

Figure 8:
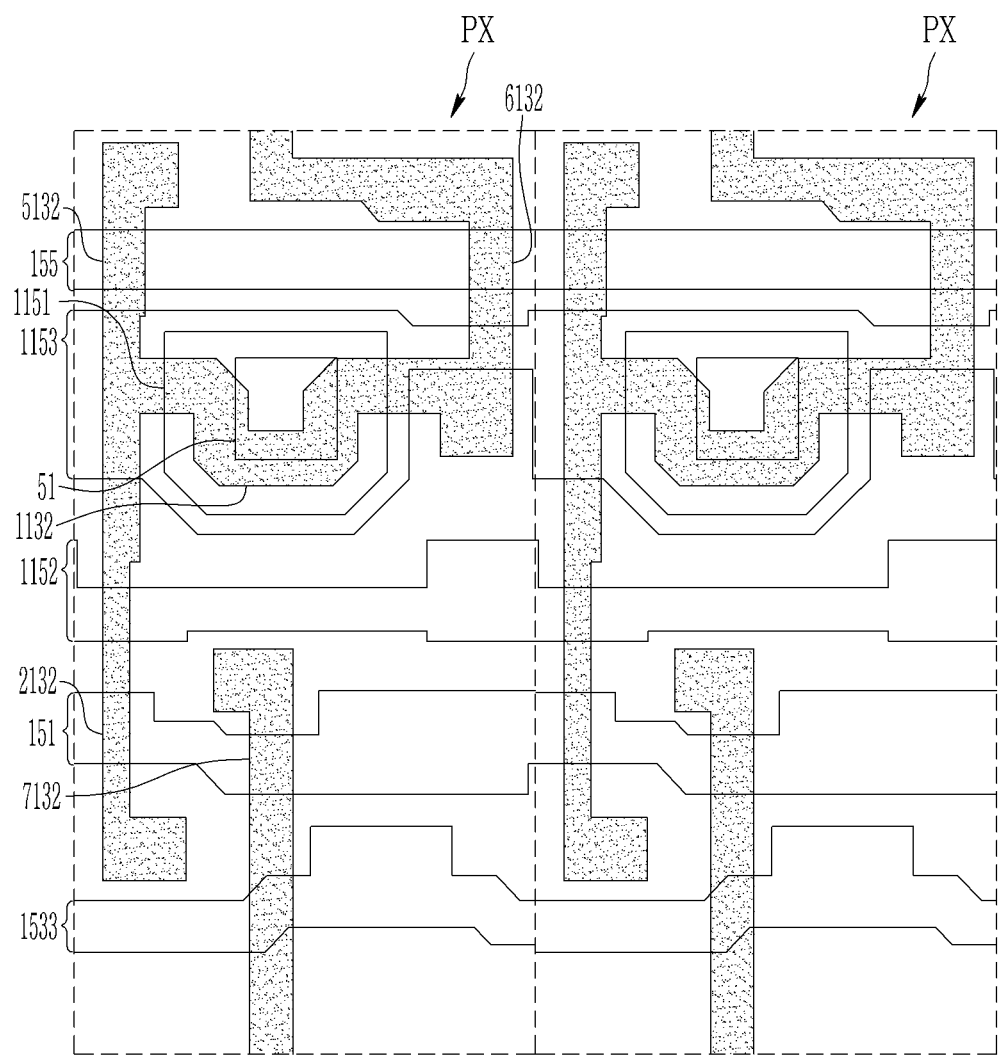

A second gate conductor including a first storage electrode 1153 of the storage capacitor Cst, a light blocking layer 1152 of the third transistor T3, and a light blocking layer 1533 of the fourth transistor T4 may be positioned on the first interlayer insulating layer 161. FIG. 8 illustrates a polycrystalline semiconductor, a first gate conductor, and a second gate conductor.

The first storage electrode 1153 may overlap the gate electrode 1151 of the driving transistor T1 to configure a storage capacitor Cst. The first storage electrode 1153 of the storage capacitor Cst may include an opening 51. The opening 51 of the first storage electrode 1153 may overlap the gate electrode 1151 of the driving transistor T1.

The light blocking layer 1152 of the third transistor T3 may overlap a channel 3132 and the gate electrode of the third transistor T3. The light blocking layer 1533 of the fourth transistor T4 may overlap the channel 4132 and the gate electrode of the fourth transistor T4.

A second interlayer insulating layer 162 may be positioned on the second gate conductor including a first storage electrode 1153 of the storage capacitor Cst, a light blocking layer 1152 of the third transistor T3, and a light blocking layer 1533 of the fourth transistor T4. The second interlayer insulating layer 162 may include a silicon nitride, a silicon oxide, or a combination thereof.

Figure 9:
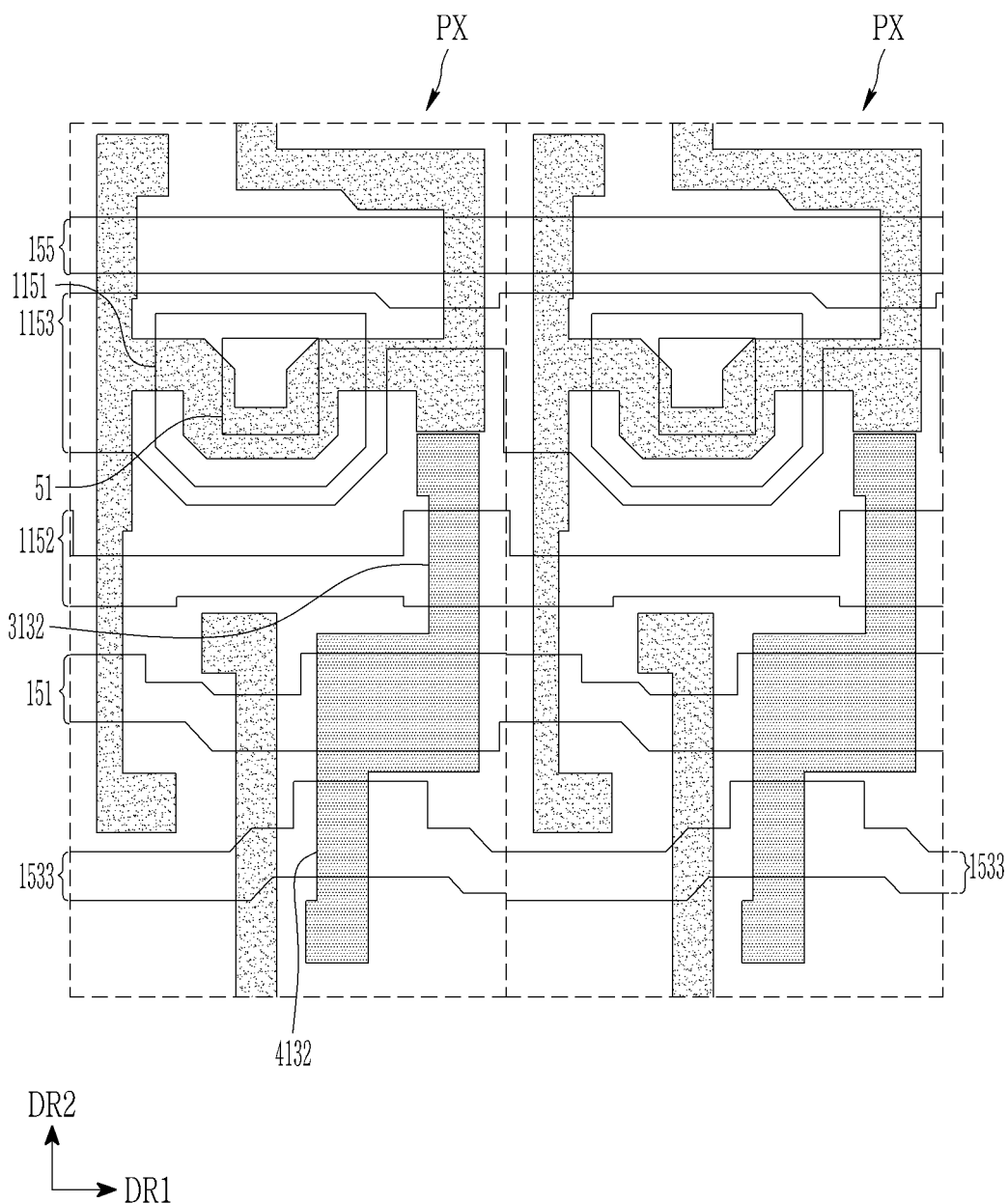

An oxide semiconductor including a channel 3132, a first electrode S3, and a second electrode D3 of the third transistor T3, and a channel 4132, a first electrode S4, and a second electrode D4 of the fourth transistor T4, may be positioned on the second interlayer insulating layer 162. FIG. 9 illustrates a polycrystalline semiconductor, a first gate conductor, a second gate conductor, and an oxide semiconductor.

The oxide semiconductor may include at least one of unary metal oxides such as an indium (In) oxide, a tin (Sn) oxide, or a zinc (Zn) oxide; binary metal oxides such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; ternary metal oxides such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and quaternary metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor may include an indium-gallium-zinc oxide (IGZO) from among the In—Ga—Zn-based oxides.

The channel 3132, the first electrode S3, and the second electrode D3 of the third transistor T3 may be extended to the channel 4132, the first electrode S4, and the second electrode D4 of the fourth transistor T4 to thus have an integrated body. The first electrode S3 and the second electrode D3 of the third transistor T3 may be positioned on respective sides of the channel 3132 of the third transistor T3. The first electrode S4 and the second electrode D4 of the fourth transistor T4 may be positioned on respective sides of the channel 4132 of the fourth transistor T4. The second electrode D3 of the third transistor T3 may be extended to the second electrode D4 of the fourth transistor T4. The channel 3132 of the third transistor T3 may overlap the light blocking layer 1152. The channel 4132 of the fourth transistor T4 may overlap the light blocking layer 1533.

The oxide semiconductor may further include a second electrode of the boost capacitor (Cboost). The second electrode of the boost capacitor (Cboost) may be extended to the second electrode D3 of the third transistor T3. The second electrode of the boost capacitor (Cboost) may be extended to the second electrode D4 of the fourth transistor T4. The second electrode of the boost capacitor (Cboost) may overlap the first electrode of the boost capacitor (Cboost). Capacity of the boost capacitor (Cboost) may be determined by an overlapping area of the first electrode and the second electrode of the boost capacitor (Cboost), and thicknesses of the first interlayer insulating layer 161 and the second interlayer insulating layer 162 positioned between the first electrode and the second electrode.

A second gate insulating layer 142 may be positioned on the oxide semiconductor including the channel 3132, the first electrode S3, and the second electrode D3 of the third transistor T3, and the channel 4132, the first electrode S4, and the second electrode D4 of the fourth transistor T4. The second gate insulating layer 142 may be positioned on the oxide semiconductor and a front side of the second interlayer insulating layer 162. Therefore, the second gate insulating layer 142 may cover upper sides and lateral sides of the channel 3132, the first electrode S3, and the second electrode D3 of the third transistor T3, and the channel 4132, the first electrode S4, and the second electrode D4 of the fourth transistor T4. However, embodiments are not limited thereto, and the second gate insulating layer 142 may not be positioned on the oxide semiconductor and the front of the second interlayer insulating layer 162. For example, the second gate insulating layer 142 may overlap the channel 3132 of the third transistor T3 and may not overlap the first electrode S3 and the second electrode D3. The second gate insulating layer 142 may overlap the channel 4132 of the fourth transistor T4, and may not overlap the first electrode S4 and the second electrode D4.

Figure 10:
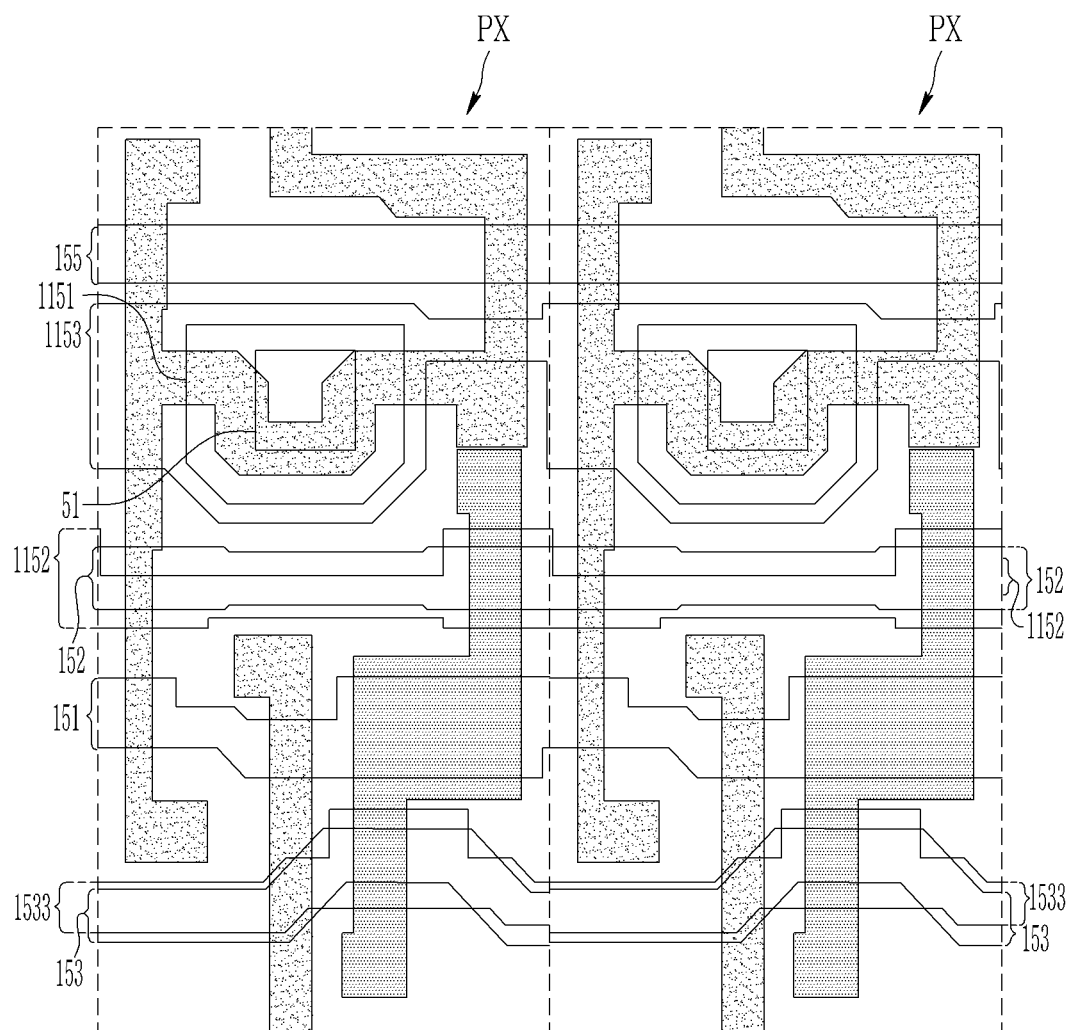

A third gate conductor including an inverted scan line 152 and an initialization control line 153 may be positioned on the second gate insulating layer 142. FIG. 10 illustrates a polycrystalline semiconductor, a first gate conductor, a second gate conductor, an oxide semiconductor, and a third gate conductor.

The inverted scan line 152 may substantially extend in the first direction DR1. The gate electrode of the third transistor T3 may be positioned on a portion where the inverted scan line 152 overlaps the channel 3132 of the third transistor T3. The gate electrode of the third transistor T3 may overlap at least one of the inverted scan line 152 and the light blocking layer 1152 of the third transistor T3. The second interlayer insulating layer 162 and the second gate insulating layer 142 may be positioned between the gate electrode of the third transistor T3 and the inverted scan line 152 and between the gate electrode of the third transistor T3 and the light blocking layer 1152. An inverted scan signal (GC) may be applied to the gate electrode of the third transistor T3 and the light blocking layer 1152 through the inverted scan line 152.

The initialization control line 153 may substantially extend in the first direction DR1. The gate electrode of the fourth transistor T4 may be positioned on a portion where the initialization control line 153 overlaps the channel 4132 of the fourth transistor T4. At least one of the gate electrode of the fourth transistor T4 and the initialization control line 153 may overlap the light blocking layer 1533 of the fourth transistor T4. The second interlayer insulating layer 162 and the second gate insulating layer 142 may be positioned between the gate electrode of the fourth transistor T4 and the light blocking layer 1533 and between the initialization control line 153 and the light blocking layer 1533 of the fourth transistor T4. An initialization control signal (GI) may be applied to the gate electrode of the fourth transistor T4 and the light blocking layer 1533 through the initialization control line 153.

A third gate conductor including the inverted scan line 152 and the initialization control line 153 may be formed and a doping process may be performed. Except for the portion of the oxide semiconductor covered by the third gate conductor, the portion of the oxide semiconductor not covered by the third gate conductor may be doped to have a same characteristic as a conductor. The channel 3132 of the third transistor T3 may be positioned below the gate electrode so that it may overlap the gate electrode. The first electrode S3 and the second electrode D3 of the third transistor T3 may not overlap the gate electrode. The channel 4132 of the fourth transistor T4 may be positioned below the gate electrode so that it may overlap the gate electrode. The first electrode S4 and the second electrode D4 of the fourth transistor T4 may not overlap the gate electrode. The doping process on the oxide semiconductor may be performed with an n-type dopant, and the third transistor T3 including an oxide semiconductor and the fourth transistor T4 may have an n-type transistor characteristic.

A third interlayer insulating layer 163 may be positioned on the third gate conductor. The third interlayer insulating layer 163 may include a silicon nitride, a silicon oxide, or a combination thereof.

Figure 11:
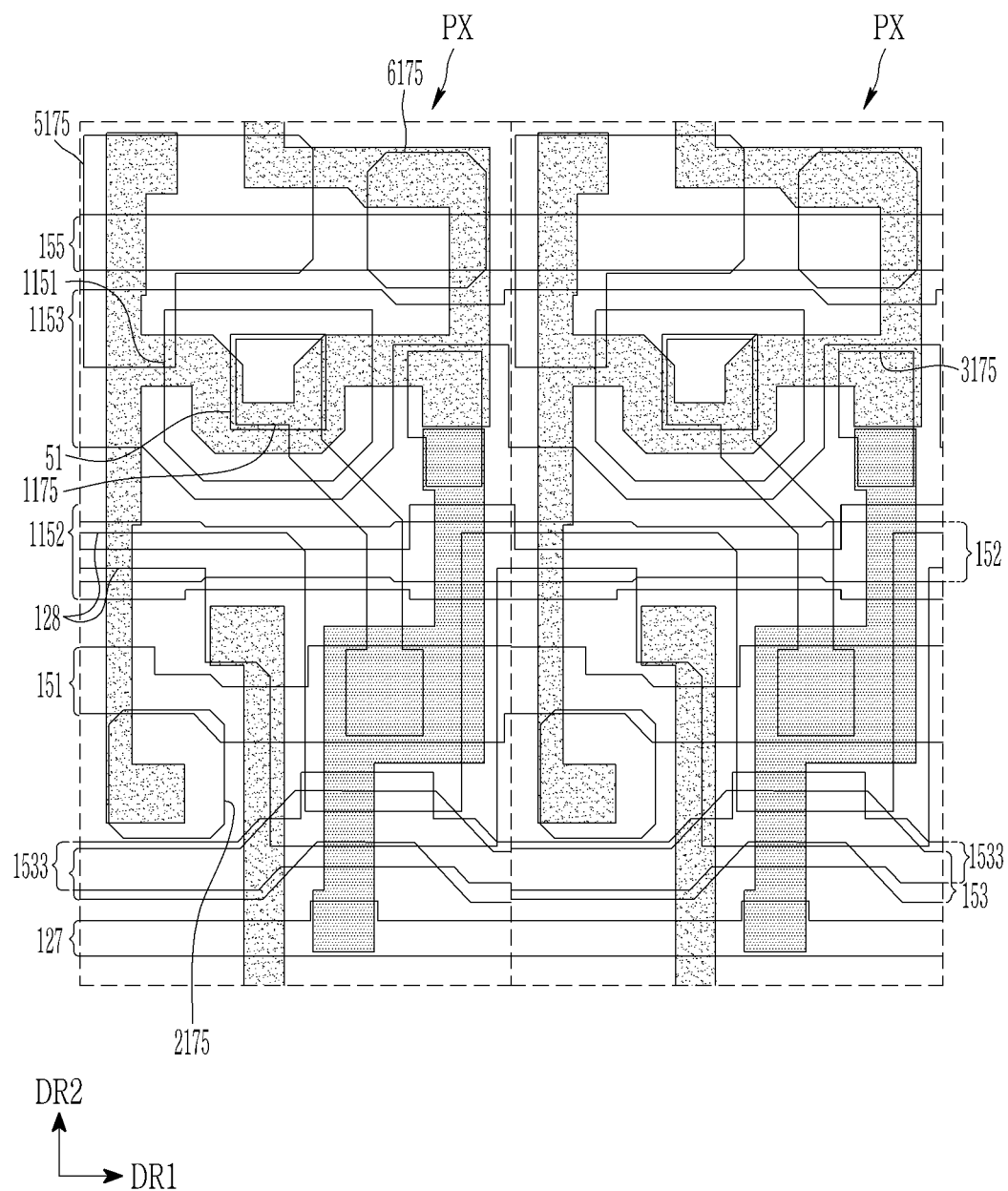

A first data conductor including a first initialization voltage line 127, a first connection electrode 1175, a second initialization voltage line 128, a second connection electrode 2175, a third connection electrode 3175, a fourth connection electrode 5175, and a fifth connection electrode 6175 may be positioned on the third interlayer insulating layer 163. FIG. 11 illustrates a polycrystalline semiconductor, a first gate conductor, a second gate conductor, an oxide semiconductor, a third gate conductor, and a first data conductor.

The first initialization voltage line 127 may substantially extend in the first direction DR1. The first initialization voltage line 127 may include an expansion partly expanding in the first direction DR1. The expansion of the first initialization voltage line 127 may overlap the first electrode S4 of the fourth transistor T4. The expansion of the first initialization voltage line 127 may be electrically connected to the first electrode S4 of the fourth transistor T4 through an opening 65 formed in the first gate insulating layer 141, the first interlayer insulating layer 161, the second interlayer insulating layer 162, the second gate insulating layer 142, and the third interlayer insulating layer 163.

The first connection electrode 1175 may include a first connector overlapping the gate electrode 1151 of the driving transistor T1, a second connector overlapping the first electrode S3 of the third transistor T3, and a main body positioned between the first connector and the second connector. The first connector of the first connection electrode 1175 may be electrically connected to the gate electrode 1151 of the driving transistor T1 through the first opening 71 formed in the first interlayer insulating layer 161, the second interlayer insulating layer 162, the second gate insulating layer 142, and the third interlayer insulating layer 163, and the opening 51 of the first storage electrode 1153. The second connector of the first connection electrode 1175 may be electrically connected to the first electrode S3 of the third transistor T3 through the second opening 64 formed in the second gate insulating layer 142 and the third interlayer insulating layer 163. The second connector of the first connection electrode 1175 may overlap the boost capacitor (Cboost), and may be electrically connected to the second electrode of the boost capacitor (Cboost). Therefore, the gate electrode 1151 of the driving transistor T1 may be electrically connected to the second electrode of the boost capacitor (Cboost) by the first connection electrode 1175.

The second initialization voltage line 128 may substantially extend in the first direction DR1 as a zigzag shape including a curved portion in a plan view. A constant voltage may be applied to the second initialization voltage line 128.

In a plan view, the curved portion of the second initialization voltage line 128 may be positioned to surround the boost capacitor (Cboost). The curved portion of the second initialization voltage line 128 may be positioned to surround at least part of the second connector of the first connection electrode 1175. Part of the curved portion of the second initialization voltage line 128 may be positioned to surround the second connector of the first connection electrode 1175 on which the second opening 64 may be positioned on three sides. Regarding an emissive display device according to a comparative example, the second initialization voltage line 128 may substantially extend without a curved portion in the first direction DR1. On the contrary, in an embodiment, the second initialization voltage line 128 includes a curved portion for surrounding the second connector of the first connection electrode 1175, so the second initialization voltage line 128 may partly shield the change of voltage at the data line 171, and may minimize parasitic capacitance that may be generated between the gate electrode 1151 of the driving transistor T1 and the data line 171. This effect may be confirmed with reference to FIG. 13.

In a cross-sectional view, the second initialization voltage line 128 may be positioned between the first connection electrode 1175 and the data line 171, thereby minimizing parasitic capacitance between the data line 171 and the gate electrode 1151 of the driving transistor T1. Accordingly, interference between the data signal transmitted through the data line 171 and the gate voltage applied to the gate electrode 1151 of the driving transistor T1 may be prevented.

The second initial voltage line 128 may overlap the second electrode D7 of the seventh transistor T7. The second initial voltage line 128 may be electrically connected to the second electrode D7 of the seventh transistor T7 through the opening 68 formed in the first gate insulating layer 141, the first interlayer insulating layer 161, the second interlayer insulating layer 162, the second gate insulating layer 142, and the third interlayer insulating layer 163.

The second connection electrode 2175 may overlap the first electrode S2 of the second transistor T2. The second connection electrode 2175 may be electrically connected to the first electrode S2 of the second transistor T2 through the opening 63 formed in the first gate insulating layer 141, the first interlayer insulating layer 161, the second interlayer insulating layer 162, the second gate insulating layer 142, and the third interlayer insulating layer 163. The second connection electrode 2175 may overlap the data line 171, and may be electrically connected to the data line 171 to transmit the data voltage (DATA) to the first electrode S2 of the second transistor T2.

The third connection electrode 3175 may overlap the second electrode D1 of the driving transistor T1 and the first electrode S3 of the third transistor T3. The third connection electrode 3175 may be electrically connected to the second electrode D1 of the driving transistor T1 through the opening 61 formed in the first gate insulating layer 141, the first interlayer insulating layer 161, the second interlayer insulating layer 162, the second gate insulating layer 142, and the third interlayer insulating layer 163. The third connection electrode 3175 may also be electrically connected to the first electrode S3 of the third transistor T3 through the opening 62 formed in the second gate insulating layer 142 and the third interlayer insulating layer 163.

The fourth connection electrode 5175 may overlap the fifth transistor T5, the first storage electrode 1153, and the driving voltage line 172. The fourth connection electrode 5175 may be electrically connected to the first storage electrode 1153 through the opening 72 formed in the first interlayer insulating layer 161, the second interlayer insulating layer 162, the second gate insulating layer 142, and the third interlayer insulating layer 163. The fourth connection electrode 5175 may be electrically connected to the first electrode S5 of the fifth transistor T5 through the opening 66 formed in the first gate insulating layer 141, the first interlayer insulating layer 161, the second interlayer insulating layer 162, the second gate insulating layer 142, and the third interlayer insulating layer 163. The fourth connection electrode 5175 may receive the driving voltage (ELVDD) from the driving voltage line 172 and may transmit the same to the fifth transistor T5.

The fifth connection electrode 6175 may overlap the channel 6132 and the second electrode D6 of the sixth transistor T6. The fifth connection electrode 6175 may be electrically connected to the second electrode D6 of the sixth transistor T6 through the opening 67 formed in the first gate insulating layer 141, the first interlayer insulating layer 161, the second interlayer insulating layer 162, the second gate insulating layer 142, and the third interlayer insulating layer 163.

A first planarization film 181 may be positioned on the first data conductor. The first planarization film 181 may include at least one organic material of a polyimide, a polyamide, an acryl resin, benzocyclobutene, and a phenol resin.

Figure 12:
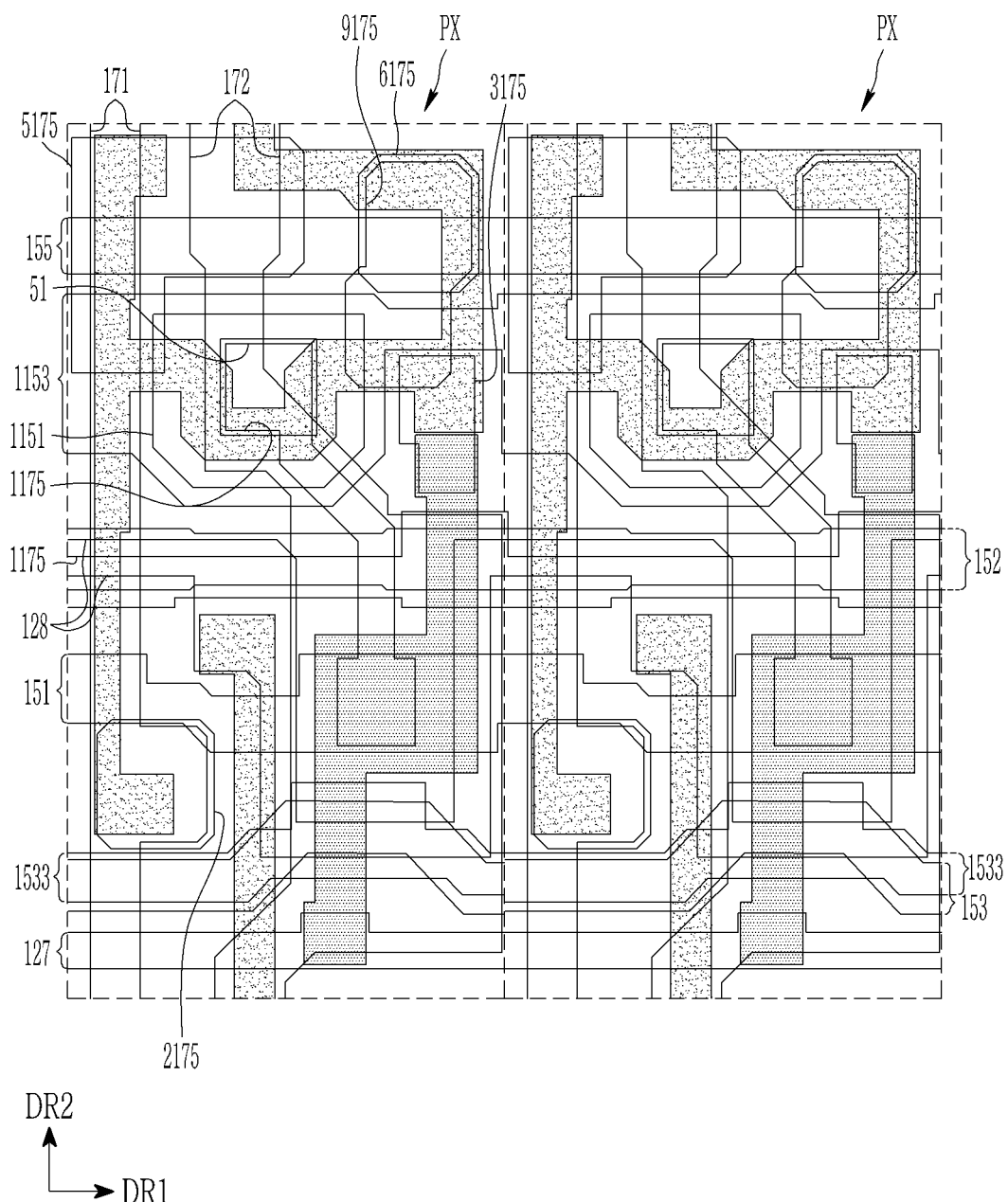

A second data conductor including a data line 171, a driving voltage line 172, and a pixel connection electrode 9175 may be positioned on the first planarization film 181. FIG. 12 illustrates a polycrystalline semiconductor, a first gate conductor, a second gate conductor, an oxide semiconductor, a third gate conductor, a first data conductor, and a second data conductor.

The data line 171 may substantially extend in the second direction DR2, and may include an expansion partly expanding in the first direction DR1. The expansion of the data line 171 may overlap the second connection electrode 2175. The expansion of the data line 171 may be electrically connected to the first electrode S2 of the second transistor T2 through the second connection electrode 2175. The data line 171 may be electrically connected to the second connection electrode 2175 through the opening 80 formed in the first planarization film 181, and the second connection electrode 2175 may be electrically connected to the first electrode S2 of the second transistor T2 through the opening 63. Accordingly, the data line 171 may apply the data voltage (DATA) to the second transistor T2.

The driving voltage line 172 may substantially extend in the second direction DR2, and may include an expansion having a width that may be different in the first direction DR1 and an oblique portion that may be bent in an oblique way. The driving voltage line 172 may overlap the fourth connection electrode 5175. The driving voltage line 172 may be electrically connected to the first electrode S5 of the fifth transistor T5 through the fourth connection electrode 5175. The driving voltage line 172 may be electrically connected to the fourth connection electrode 5175 through the opening 82 formed in the first planarization film 181, and the fourth connection electrode 5175 may be electrically connected to the first electrode S5 of the fifth transistor T5 through the opening 66. Accordingly, the driving voltage line 172 may apply a driving voltage (ELVDD) to the fifth transistor T5. The driving voltage line 172 may also be electrically connected to the storage capacitor Cst through the fourth connection electrode 5175. Therefore, the driving voltage line 172 may apply a driving voltage (ELVDD) to the first storage electrode 1153 of the storage capacitor Cst. The first storage electrodes 1153 of the storage capacitors Cst of the adjacent pixels may be electrically connected to each other, and may substantially extend in the first direction DR1.

The pixel connection electrode 9175 may overlap the third connection electrode 3175. The pixel connection electrode 9175 may be electrically connected to the third connection electrode 3175 through the opening 73 formed in the first planarization film 181. The pixel connection electrode 9175 may also be electrically connected to an anode 191 to be described.

A second planarization film 182 may be positioned on the second data conductor. The second planarization film 182 may include at least one organic material of a polyimide, a polyamide, an acryl resin, benzocyclobutene, and a phenol resin.

An anode 192 may be positioned on the second planarization film 182. The anode 192 may be electrically connected to the pixel connection electrode 9175 through the opening 81 formed in the second planarization film 182. Accordingly, the anode 192 may be electrically connected to the sixth transistor T6 through the pixel connection electrode 9175 and the third connection electrode 3175, and it may receive an output current of the driving transistor T1.

A partition wall 350 may be positioned on the anode 191. An opening may be formed in the partition wall 350, and it may overlap the anode 191. A light-emitting device layer 370 may be positioned in the opening of the partition wall 350. A cathode 270 may be positioned on the light-emitting device layer 370. The anode 191, the light-emitting device layer 370, and the cathode 270 may configure a light emitting diode (LED).

Regarding the emissive display device according to an embodiment, the driving transistor T1 may include a polycrystalline semiconductor, and the third transistor T3 and the fourth transistor T4 may include oxide semiconductors. By allowing the third transistor T3 and the fourth transistor T4 to include the driving transistor T1 and different semiconductor materials as described above, they may be more stably driven and reliability may be improved.

A quality improving effect of an emissive display device according to an embodiment will now be described with reference to FIG. 13.

Figure 13:
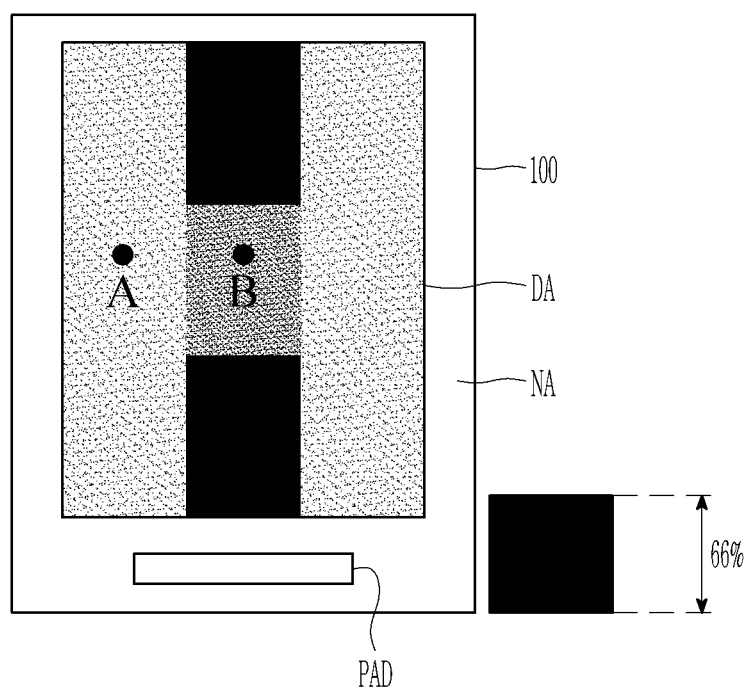
FIG. 13 shows a schematic diagram on an effect of an emissive display device according to an embodiment.

FIG. 13 shows a schematic diagram on an effect of an emissive display device according to an embodiment.

Referring to FIG. 13, regarding the emissive display device, a substrate 100 may include a display area (DA) and a non-display area (NA). The display area (DA) may represent a region for displaying images, and the non-display area (NA) may represent a region for displaying images surrounding the display area (DA). A pad (PAD) may be positioned in the non-display area (NA).

The display area (DA) may be partitioned as a first portion, a second portion, and a third portion. A data voltage may be written on the first portion and the third portion so as to display a bright gray, and it may be written on the second portion positioned between the first portion and third portion so as to display a dark black and a bright gray. Crosstalk caused by a difference between the data voltage for displaying black and the data voltage for displaying a gray may be generated on the second portion where the gray changes. For example, in case that the voltage is applied so as to display a bright gray on the pixel, the voltage value stored in the pixel may be lowered because of the data voltage (a high data voltage) for displaying black is applied to the data line, so the displayed luminance may also be reduced. The above-noted crosstalk may be caused by parasitic capacitance between the data line and the driving gate electrode on the pixel, and the crosstalk may also be reduced in the invention for reducing the parasitic capacitance.

In case that crosstalk is generated, a dark gray may be displayed on a center portion of the second portion, and in case that a point A of the first portion is compared to a point B of the second portion, the crosstalk improving effect may be confirmed.

Table 1 may be obtained by comparing the point A and the point B in the emissive display device according to a comparative example and the emissive display device according to an embodiment, and confirming generation degrees of crosstalk.

It may be found in the emissive display device according to a comparative example that 0.65% of crosstalk may be generated in case that the point A may be compared to the point B, and it may be found in the emissive display device according to an embodiment that it may be reduced to 0.23%.

In Table 1, *1.5 given to the right side represents 1.5 times 0.23% of a measured value so as to uniformly control a specification of the emissive display device.

TABLE 1

|  | Crosstalk | Crosstalk *1.5 |
| --- | --- | --- |
| Comparative Example | 0.65% | 0.98% |
| Example embodiment | 0.23% | 0.34% |

As expressed in Table 1, the emissive display device according to an embodiment may position the second initialization voltage line between the first connection electrode and the data line, thereby minimizing the parasitic capacitance between the data line and the driving gate electrode. Accordingly, quality of the emissive display device may be improved by preventing the interference between the data signal transmitted through the data line and the gate voltage applied to the gate electrode of the driving transistor. On the contrary, regarding the emissive display device according to a comparative example, the second initialization voltage line substantially extends in the horizontal direction without a curved portion, so the change of voltage at the data line may give influence between the driving gate electrodes, and significant crosstalk may be generated between the data line and the driving gate electrode.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims including their equivalents.

What is claimed is:

1. An emissive display device comprising:
   a polycrystalline semiconductor including a channel, a source region, and a drain region of a driving transistor disposed on a substrate;
   a gate electrode of the driving transistor overlapping the channel of the driving transistor;
   an oxide semiconductor including a channel, a source region, and a drain region of a second transistor disposed on the substrate;
   a first connection electrode including:
   a first connector electrically connected to the gate electrode of the driving transistor;
   a first electrode of the second transistor;
   a second connector electrically connected to a second electrode of the second transistor; and
   a main body disposed between the first connector and the second connector; and an initialization voltage line disposed on the substrate and applying an initialization voltage,
wherein the initialization voltage line surrounds at least a part of the second connector of the first connection electrode.

2. The emissive display device of claim 1, further comprising:
a third transistor disposed on the substrate and including a channel, a source region, and a drain region, wherein the polycrystalline semiconductor forms the channel, the source region, and the drain region of the third transistor; and
a fourth transistor disposed on the substrate and including a channel, a source region, and a drain region, wherein the oxide semiconductor forms the channel, the source region, and the drain region of the fourth transistor,
wherein the initialization voltage line further includes:
a first initialization voltage line electrically connected to the source region of the fourth transistor; and
a second initialization voltage line electrically connected to the drain region of the third transistor.

3. The emissive display device of claim 2, wherein the second initialization voltage line surrounds at least a part of the second connector of the first connection electrode.

4. The emissive display device of claim 2, further comprising:
a scan line disposed on the substrate and extending in a first direction; and
a data line extending in a second direction that is perpendicular to the first direction, wherein
the first initialization voltage line extends in the first direction, and
the second initialization voltage line extends in a zigzag shape and includes a curved portion in the first direction.

5. The emissive display device of claim 4, wherein
a part of the curved portion of the second initialization voltage line surrounds the second connector of the first connection electrode on three sides.

6. The emissive display device of claim 2, further comprising:
a first gate insulating layer disposed on the polycrystalline semiconductor and covering the polycrystalline semiconductor;
a first interlayer insulating layer disposed on the first gate insulating layer and covering the first gate insulating layer and the gate electrode of the driving transistor;
a second interlayer insulating layer disposed on the first interlayer insulating layer and covering the first interlayer insulating layer;
a second gate insulating layer disposed on the second interlayer insulating layer and covering the second interlayer insulating layer;
a third interlayer insulating layer disposed on the second gate insulating layer and covering the second gate insulating layer; and
a first planarization film disposed on the third interlayer insulating layer and covering the third interlayer insulating layer,
wherein the oxide semiconductor is disposed between the second interlayer insulating layer and the second gate insulating layer.

7. The emissive display device of claim 6, wherein
the first connection electrode is disposed between the third interlayer insulating layer and the first planarization film, and the first initialization voltage line, the second initialization voltage line, and the first connection electrode are disposed on a same layer.

8. The emissive display device of claim 6, further comprising:
a data line disposed on the first planarization film.

9. The emissive display device of claim 6, wherein
the first connector of the first connection electrode is electrically connected to the gate electrode of the driving transistor through a first opening formed in the first interlayer insulating layer, the second interlayer insulating layer, the second gate insulating layer, and the third interlayer insulating layer.

10. The emissive display device of claim 6, wherein
the second connector of the first connection electrode is electrically connected to the source region of the second transistor through a second opening formed in the second gate insulating layer and the third interlayer insulating layer.

11. An emissive display device including pixels respectively including at least one transistor and a storage capacitor disposed on a substrate, the at least one transistor comprising:
a driving transistor including a gate electrode, a channel overlapping the gate electrode, a source region, and a drain region, the channel being disposed between the source region and the drain region;
a second transistor including a second gate electrode, a channel overlapping the second gate electrode, a source region, and a drain region, the channel being disposed between the source region and the drain region;
a third transistor including a third gate electrode, a channel overlapping the third gate electrode, a source region, and a drain region, the channel being disposed between the source region and the drain region; and
a fourth transistor including a fourth gate electrode, a channel overlapping the fourth gate electrode, a source region, and a drain region, the channel being disposed between the source region and the drain region, wherein
the channels, the source regions, and the drain regions of the driving transistor and the second transistor include polycrystalline semiconductors,
the channels, the source regions, and the drain regions of the third transistor and the fourth transistor include oxide semiconductors, and
gaps of gate electrodes of driving transistors disposed on adjacent ones of the pixels are substantially the same.

12. The emissive display device of claim 11, wherein
the pixels further include:
a first storage electrode overlapping the gate electrode of the driving transistor; and
a first interlayer insulating layer disposed between the gate electrode of the driving transistor and the first storage electrode, and
the first storage electrode and the gate electrode of the driving transistor form the storage capacitor.

13. The emissive display device of claim 11, wherein the pixels further include a first connection electrode including:
a first connector electrically connected to the gate electrode of the driving transistor;
a second connector electrically connected to the drain region of the third transistor; and
a main body disposed between the first connector and the second connector.

14. The emissive display device of claim 13, wherein the at least one transistor further includes a fifth transistor including:
a fifth gate electrode, a channel overlapping the fifth gate electrode, a source region, and a drain region, the channel being disposed between the source region and the drain region, and
the pixels further include:
a first initialization voltage line disposed on the substrate and electrically connected to the source region of the fourth transistor; and
a second initialization voltage line disposed on the substrate and electrically connected to the drain region of the fifth transistor.

15. The emissive display device of claim 14, wherein the second initialization voltage line surrounds at least a part of the second connector of the first connection electrode in a plan view.

16. The emissive display device of claim 14, wherein the pixels further include:
a scan line disposed on the substrate and extending in a first direction; and
a data line extending in a second direction that is perpendicular to the first direction, wherein
the first initialization voltage line extends in the first direction, and
the second initialization voltage line extends with a zigzag shape and includes a curved portion in the first direction.

17. The emissive display device of claim 16, further comprising:
a first gate insulating layer disposed on the polycrystalline semiconductor and covering the polycrystalline semiconductor;
a first interlayer insulating layer disposed on the first gate insulating layer and covering the first gate insulating layer and the gate electrode of the driving transistor;
a second interlayer insulating layer disposed on the first interlayer insulating layer and covering the first interlayer insulating layer;
a second gate insulating layer disposed on the second interlayer insulating layer and covering the second interlayer insulating layer;
a third interlayer insulating layer disposed on the second gate insulating layer and covering the second gate insulating layer; and
a first planarization film disposed on the third interlayer insulating layer and covering the third interlayer insulating layer,
wherein the oxide semiconductor is disposed between the second interlayer insulating layer and the second gate insulating layer.

18. The emissive display device of claim 17, wherein
the first connection electrode is disposed between the third interlayer insulating layer and the first planarization film, and
the first initialization voltage line, the second initialization voltage line, and the first connection electrode are disposed on a same layer.

19. The emissive display device of claim 18, further comprising:
the data line disposed on the first planarization film.

20. The emissive display device of claim 19, wherein the pixels respectively include a boost capacitor, the boost capacitor including:
a source region of the boost capacitor electrically connected to the second gate electrode of the second transistor; and
a drain region of the boost capacitor electrically connected to the drain region of the third transistor.

* * * * *